United States Patent
Minemura et al.

(10) Patent No.: US 8,441,040 B2
(45) Date of Patent: May 14, 2013

(54) SEMICONDUCTOR MEMORY DEVICE

(75) Inventors: Yoichi Minemura, Yokkaichi (JP); Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 12/886,090

(22) Filed: Sep. 20, 2010

(65) Prior Publication Data

US 2011/0068373 A1    Mar. 24, 2011

(30) Foreign Application Priority Data

Sep. 24, 2009    (JP) .................................. 2009-219263

(51) Int. Cl.
*H01L 23/52* (2006.01)

(52) U.S. Cl.
USPC .................................... 257/210; 257/E27.105

(58) Field of Classification Search .................. 257/210, 257/211, E27.105
See application file for complete search history.

(56) References Cited

U.S. PATENT DOCUMENTS

| | | | | |
|---|---|---|---|---|
| 7,265,448 | B2 * | 9/2007 | Sutardja | 257/758 |
| 8,044,456 | B2 * | 10/2011 | Nagashima et al. | 257/326 |
| 8,183,602 | B2 * | 5/2012 | Tabata et al. | 257/211 |
| 8,222,677 | B2 * | 7/2012 | Baba et al. | 257/211 |
| 2005/0269615 | A1 * | 12/2005 | Goo et al. | 257/296 |
| 2006/0197115 | A1 * | 9/2006 | Toda | 257/248 |
| 2006/0202341 | A1 * | 9/2006 | Ito | 257/758 |
| 2010/0032725 | A1 | 2/2010 | Baba et al. | |
| 2010/0038616 | A1 | 2/2010 | Nagashima et al. | |

FOREIGN PATENT DOCUMENTS

| | | |
|---|---|---|
| JP | 2005-522045 | 7/2005 |
| JP | 2006-514440 | 4/2006 |
| JP | 2006-344349 | 12/2006 |
| JP | 2007-214567 | 8/2007 |
| JP | 2009-130140 | 6/2009 |
| JP | 2010-40977 | 2/2010 |

OTHER PUBLICATIONS

U.S. Appl. No. 13/052,174, filed Mar. 21, 2011, Shimotori, et al.
Office Action issued Nov. 22, 2011, in Japanese Patent Application No. 2009-219263 with English translation.

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

A semiconductor memory device according to an embodiment includes: a cell array block having, above a semiconductor substrate, a plurality of first and second wirings intersecting with one another, and a plurality of memory cells, the first and second wirings being separately formed in a plurality of layers in a perpendicular direction to the semiconductor substrate; and a first via wiring, connecting the first wiring in an $n_1$-th layer of the cell array block with the first wiring in an $n_2$-th layer, the semiconductor substrate or another metal wiring, and extending in a laminating direction of the cell array block. The first via wiring has a cross section orthogonal to the laminating direction of the cell array block. The cross section has an elliptical shape and a longer diameter in a direction perpendicular to the first wiring direction.

20 Claims, 12 Drawing Sheets

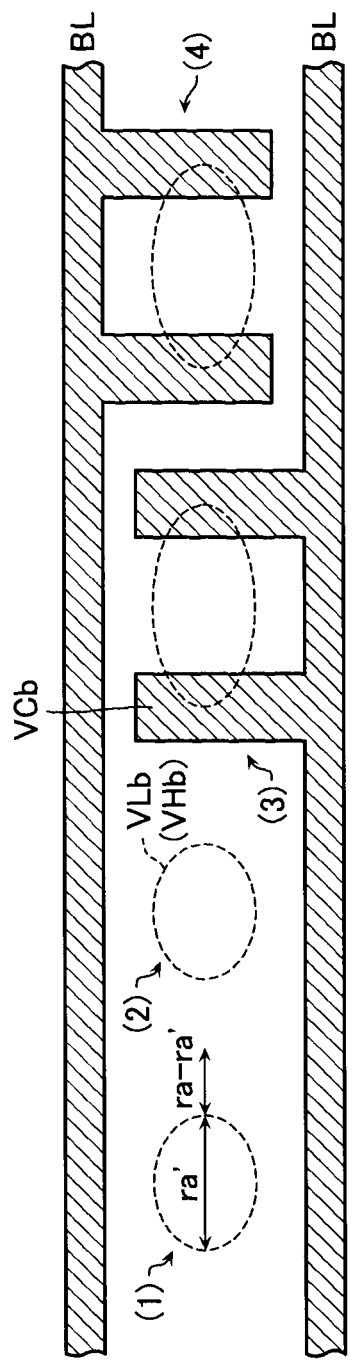

SEMICONDUCTOR MEMORY DEVICE

CROSS-REFERENCE TO RELATED APPLICATIONS

This application is based upon and claims the benefit of priority from Japanese Patent Application No. 2009-219263, filed on Sep. 24, 2009, the entire contents of which are incorporated herein by reference.

FIELD

The present invention relates to a semiconductor memory device.

BACKGROUND

Description of the Related Art

As an electrically rewritable nonvolatile semiconductor memory, a flash memory is well known in which a memory cell array is constituted of NAND-connected or NOR-connected memory cells having a floating gate structure. Further, as a nonvolatile fast random access memory, a ferroelectric memory is also known.

Meanwhile, as a technique for further pattering a memory cell, a resistance-change memory has been proposed which uses a variable resistive element for a memory cell. As the variable resistive element, there are known: a phase-change memory element that varies a resistance value in accordance with a crystal/amorphous state change of a chalcogenide compound; an MRAM element that uses a resistance change due to a tunnel magnetic resistance effect; a polymer ferroelectric RAM (PFRAM) memory element with a resistive element formed of a conductive polymer; a ReRAM element that causes a resistance change by electrical pulse application, and the like (Japanese Patent Application Laid-Open No. 2006-344349, paragraph 0021).

In this resistance-change memory, since a memory cell can be configured of a serial circuit of a Schottky diode and a resistance variation element in place of a transistor, it is possible to adopt a cross-point structure where a memory is arranged in a crossing section of upper and lower wiring. The resistance-change memory thus has an advantage in being easily formable and further increasing its package density (Japanese Patent Application Laid-Open No. 2005-522045).

Many semiconductor devices having such a laminating structure are provided with via wiring for connecting wiring in a predetermined cell array layer with wiring in a cell array layer different from the predetermined one. Therefore, the end of wiring in each cell array layer needs a space for forming a via wiring connecting section aimed at connection to this via wiring, which causes a problem of increasing a chip area.

BRIEF DESCRIPTION OF THE DRAWINGS

FIG. 13 is a view showing layouts of wiring drawing parts of bit lines in a semiconductor memory according to a third embodiment.

DETAILED DESCRIPTION

A semiconductor memory device according to an embodiment includes: a semiconductor substrate; a cell array block having, on the semiconductor substrate, a plurality of first and second wirings intersecting with one another, and a plurality of memory cells connected to respective intersections of the first and second wirings, the first and second wirings are separately formed in a plurality of layers in a perpendicular direction to the semiconductor substrate; and a first via wiring, connecting first wiring in an $n_1$-th layer ($n_1$ is a natural number) of the cell array block with the first wiring in an $n_2$-th layer ($n_2$ is a natural number other than n1), the semiconductor substrate or another metal wiring, and extending in a laminating direction of the cell array block. The first via wiring has a cross section orthogonal to the laminating direction of the cell array block. The cross section has an elliptical shape and a longer diameter in a direction perpendicular to the first wiring direction.

Hereinafter, semiconductor memory devices according to embodiments are described in detail with reference to drawings.

[First Embodiment]

Figure 1:
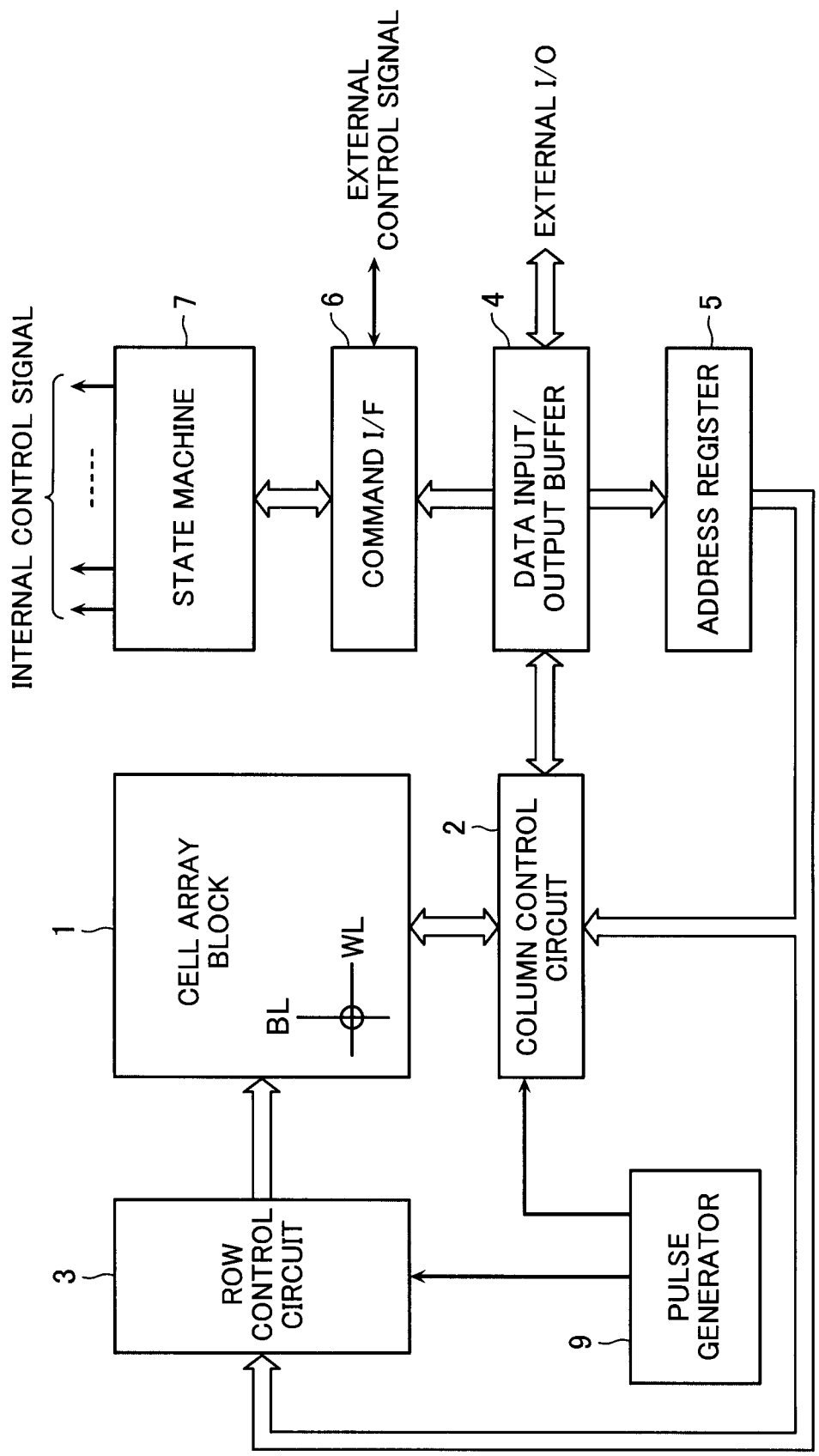
FIG. 1 is a block diagram of a semiconductor memory according to a first embodiment.

FIG. 1 is a block diagram of a semiconductor memory according to a first embodiment.

This semiconductor memory includes a cell array block 1 formed by laminating a plurality of cell array layers with memory cells arranged in matrix, the memory cells each using a later-mentioned ReRAM (variable resistive element). At a position adjacent to a bit-line BL direction of the cell array layer, a column control circuit 2 is provided which controls a bit line BL as second wiring in the cell array layer to erase data from the memory cell, write data into the memory cell, and read data from the memory cell. Further, at a position adjacent to a word-line WL direction of the cell array layer, a row control circuit 3 is provided which selects a word line WL as first wiring in the cell array layer, and applies voltages required for erasing data from the memory cell, writing data into the memory cell, and reading data from the memory cell.

A data input/output buffer 4 is connected to an external host, not shown, through an I/O line, to receive write data, receive an erase instruction, output read data, and receive address data and command data. The data input/output buffer 4 transmits received write data to the column control circuit 2, and receives data read from the column control circuit 2, to output the data to the outside. An address supplied from the outside to the data input/output buffer 4 is transmitted to the column control circuit 2 and the row control circuit 3 through an address register 5. Further, a command supplied from the host to the data input/output buffer 4 is transmitted to a command interface 6. The command interface 6 receives an external control signal from the host, and determines whether the data input into the data input/output buffer 4 is write data, a command, or an address. When determining that the data is a command, the command interface 6 transfers the data as a receipt command signal to a state machine 7. The state machine 7 is one serving to manage the whole of this semiconductor memory. The state machine 7 accepts a command from the host, reads, writes and erases data, and performs management of input/output of data, and the like. Further, the external host can also receive status information managed by the state machine 7, to determine an operation result. Moreover, this status information is also used for controlling writing and erasing.

Furthermore, the state machine 7 controls a pulse generator 9. This control enables the pulse generator 9 to output a pulse with an arbitrary voltage at arbitrary timing. Herein, the formed pulse can be transferred to arbitrary wiring selected in the column control circuit 2 and the row control circuit 3.

It should be noted that the peripheral circuit elements other than the cell array block 1 can be formed in a silicon substrate immediately beneath the cell array block 1 formed in a wiring layer. It is thereby possible to make a chip area of the semiconductor memory almost equal to an area of the cell array block 1.

Figure 2:
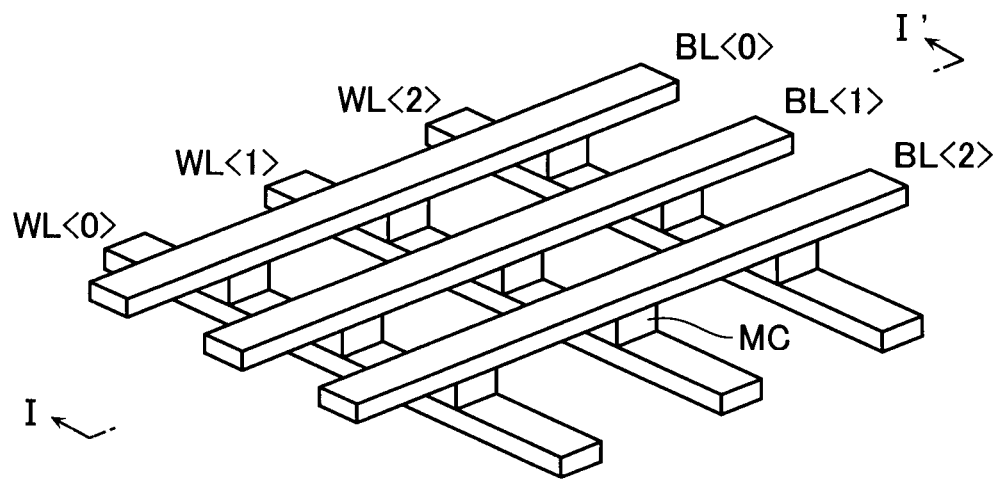
FIG. 2 is a perspective view of part of a cell array layer in the same semiconductor memory.
Figure 3:
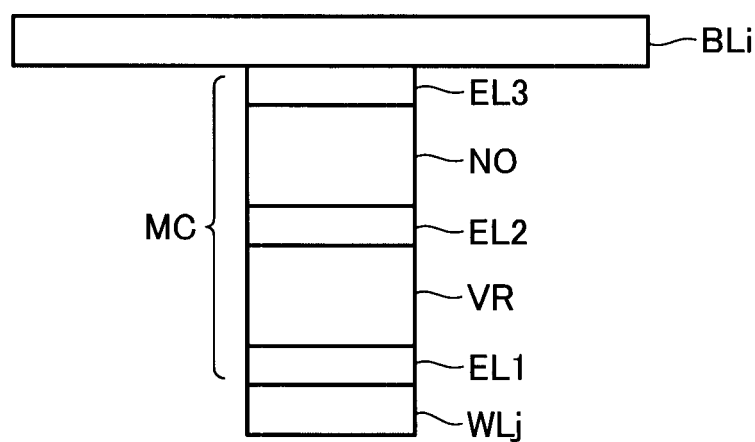
FIG. 3 is a sectional view of one memory cell cut along a line I-I' and seen in an arrow direction in FIG. 2.

FIG. 2 is a perspective view of part of the cell array layer, and FIG. 3 is a sectional view of one memory cell cut along a line I-I' and seen in an arrow direction in FIG. 2.

A plurality of word lines WL<0> to WL<2> are disposed in parallel, and intersecting with these, a plurality of bit lines BL<0> to BL<2> are disposed in parallel. A memory cell MC is arranged at each intersection of these lines so as to be sandwiched therebetween. The word line WL and the bit line BL are desirably made of a thermally resistant material with a low resistance value, and for example, W, WSi, NiSi, CoSi, or the like can be used.

As shown in FIG. 3, the memory cell MC is made up of a serial connection circuit of a variable resistive element VR and a non-ohmic element NO.

As the variable resistive element VR, there is used the one capable of varying a resistance value by voltage application through current, heat, chemical energy or the like, and on the upper or lower surface of the element, electrodes EL1, EL2 to function as a barrier metal layer and an adhesive layer are arranged. As an electrode material, there is used Pt, Au, Ag, TiAlN, SrRuO, Ru, RuN, Ir, Co, Ti, TiN, TaN, LaNiO, Al, PtIrO$_x$, PtRhO$_x$, Rh/TaAlN, or the like. Further, such a metal film as to make orientation uniform can also be interposed. Moreover, a buffer layer, a barrier metal layer, an adhesive layer or the like can also be separately interposed.

As the variable resistive element VR, there can be used the one (ReRAM) which is a composite compound containing cations as transition elements and whose resistance value changes through migration of the cations.

Figure 4:
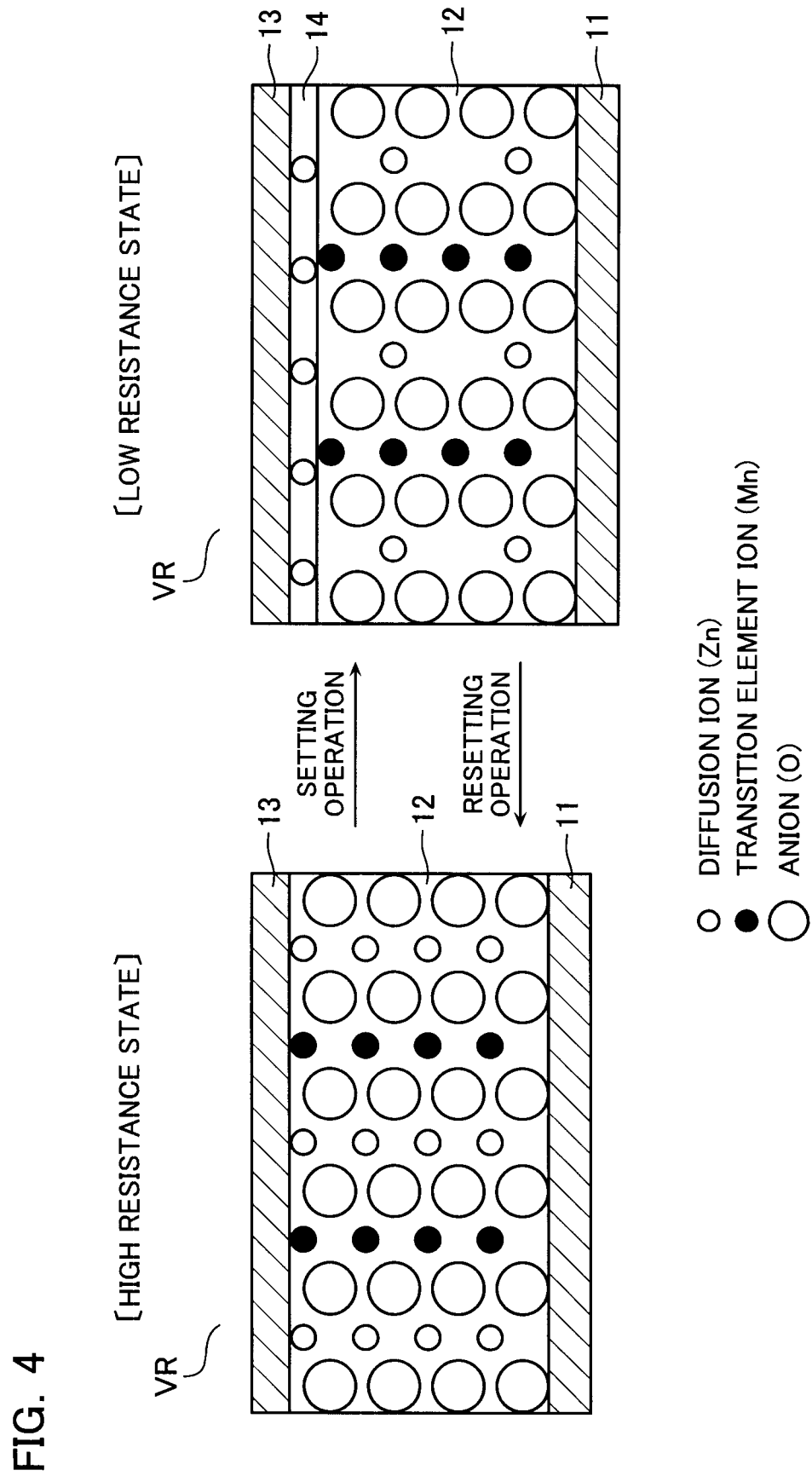
FIG. 4 is a schematic sectional view showing an example of a variable resistive element in the same semiconductor memory.

FIG. 4 is a view showing an example of this variable resistive element. The variable resistive element VR shown in FIG. 4 is formed by arranging a recording layer 12 between electrode layers 11, 13. The recording layer 12 is made up of a composite compound containing at least two kinds of cation elements. At least one of the cation elements is a transition element having a d-orbital incompletely filled with electrons, and the shortest distance between adjacent cation elements is not longer than 0.32 nm. Specifically, the cation element is represented by a chemical formula $A_xM_yX_z$ (A and M are elements different from each other) and formed of a material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_2MO_2$), or a perovskite structure ($AMO_3$).

In the example of FIG. 4, A corresponds to Zn, M to Mn, and X to O. In the recording layer 12, a small white circle represents a diffusion ion (Zn), a large white circle represents an anion (O), and a small black circle represents a transition element ion (Mn). An initial state of the recording layer 12 is a high resistance state. When a potential of the electrode layer 11 is fixed and a negative voltage is applied to the electrode layer 13, part of diffusion ions in the recording layer 12 migrate to the electrode layer 13 side, and the diffusion ions in the recording layer 12 decrease relatively to anions. The diffusion ions having migrated to the electrode layer 13 receive electrons from the electrode layer 13 and are deposited as a metal, thereby to form a metal layer 14. The anions become excessive inside the recording layer 12, leading to an increased valence of the transition element ions in the recording layer 12. Thereby, the recording layer 12 becomes electron conductive by carrier injection, whereby a setting operation is completed. As for reproduction, a current of a minute value may be allowed to flow, the value being set to the extent that the material constituting the recording layer 12 does not cause a resistance change. A programmed state (low resistance state) may be reset to the initial state (high resistance state) for example by allowing a large current to flow in the recording layer 12 for a sufficient period of time for Joule heating to promote a redox reaction in the recording layer 12. Further, the resetting operation can also be performed by application of an electric field reverse to that at the setting.

Figure 5:
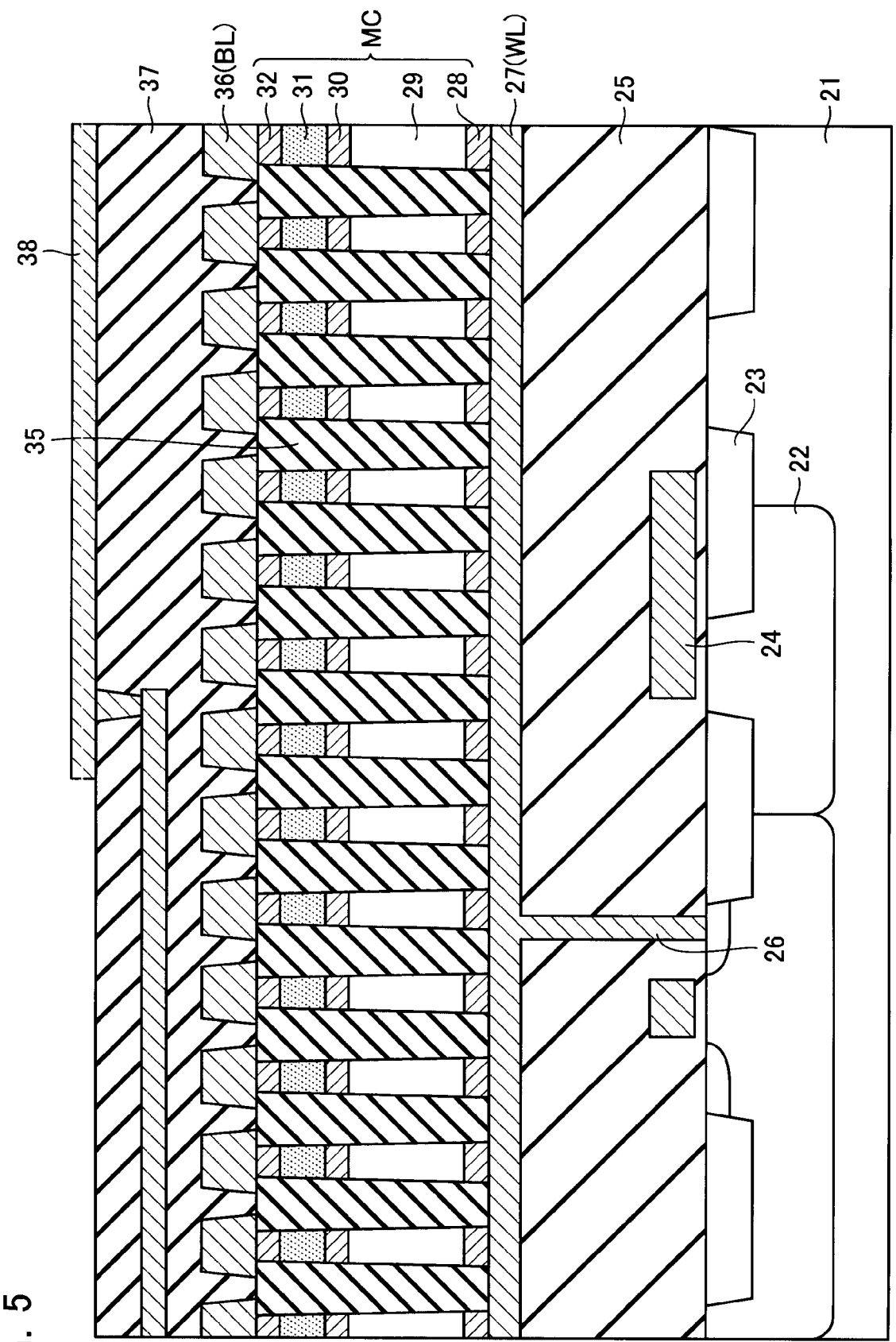
FIG. 5 is a sectional view of the same semiconductor memory.

FIG. 5 is a sectional view of the semiconductor memory according to the present embodiment. On a silicon substrate (semiconductor substrate) 21 formed with a well 22, an impurity diffused layer 23 and a gate electrode 24 of a transistor which constitute a peripheral circuit are formed. On these elements, a first interlayer insulator 25 is deposited. In this first interlayer insulator 25, via wiring 26 reaching the surface of the semiconductor substrate 21 is appropriately formed. On the first interlayer insulator 25, a first metal 27 constituting the word line WL in the cell array layer is formed of a low resistance metal such as W. In a layer above this first metal 27, a barrier metal 28 is formed. It is to be noted that the barrier metal may be formed in a layer below the first metal 27. These barrier metals can be formed of both or either Ti and/or TiN. Above the barrier metal 28, a non-ohmic element 29 such as a diode is formed. On this non-ohmic element 29, a first electrode 30, a variable resistive element 31 and a second electrode 32 are formed in this order. Thereby, the barrier metal 28 through the second electrode 32 are configured as a memory cell MC. It should be noted that a barrier metal may be interposed under the first electrode 30 and on the second electrode 32, or a barrier metal, an adhesive layer and the like may be interposed under the upper electrode 32 and on the lower electrode 30. A space between the adjacent memory cells MC is filled with a second interlayer insulator 34 and a third interlayer insulator 35 (though the second interlayer insulator 34 is not shown in FIG. 5). Further, on each memory cell MC in the memory cell array, a second metal 36 is formed which constitutes the bit line BL as second wiring extending in a direction orthogonal to the word line WL. Formed thereon are a fourth interlayer insulator 37 and a metal wiring layer 38, to form a nonvolatile memory as a variable resistance memory. It is to be noted that in order to realize a multilayered structure, lamination from the barrier metal 28 through the top electrode 32 and formation of the second and third interlayer insulators 34, 35 between the memory cells MC may be repeated by a required number of layers.

Figure 6:
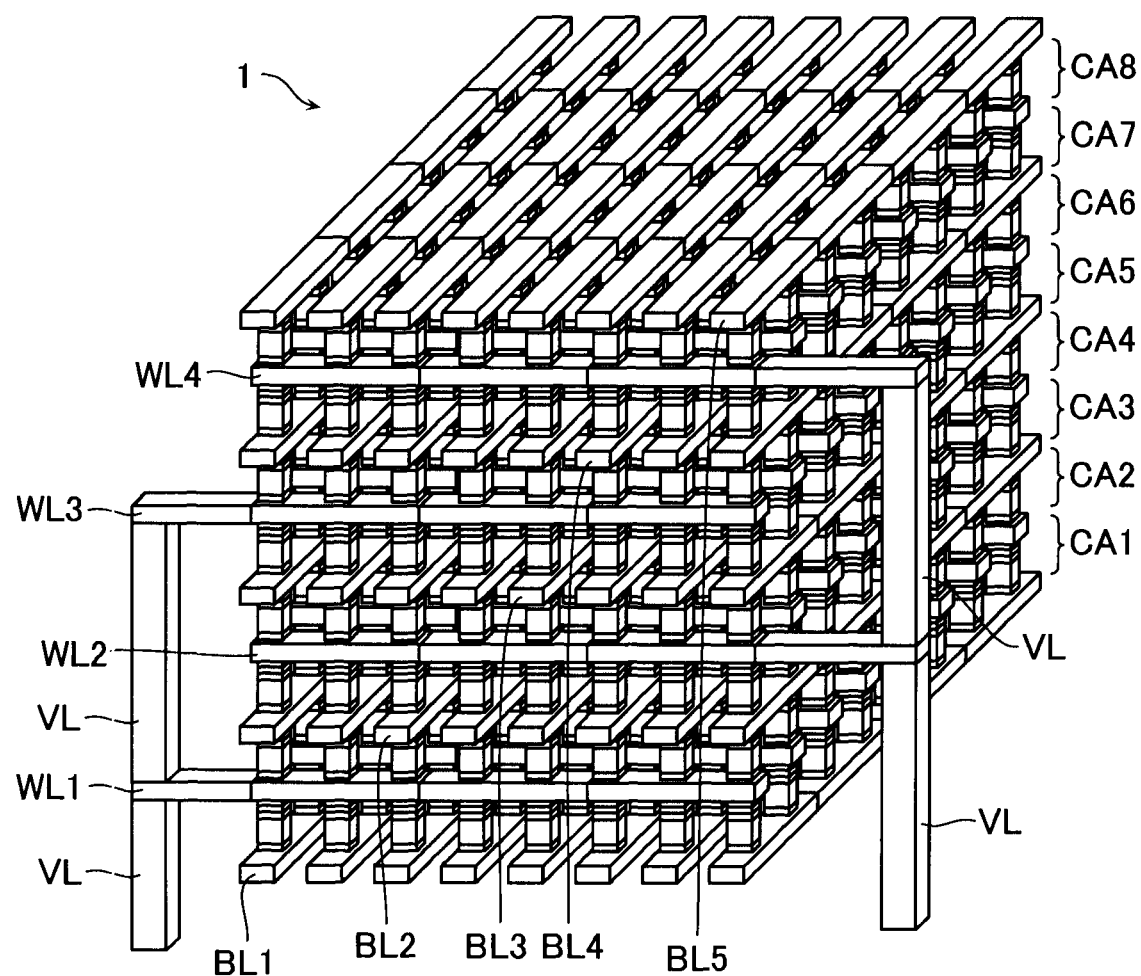
FIG. 6 is a perspective view showing a laminating structure of a cell array block in the same semiconductor memory.

FIG. 6 is a perspective view showing a laminating structure of the cell array block 1 in the semiconductor memory according to the present embodiment. This cell array block 1 is provided with eight cell array layers CA1 to CA8, and the word line WL or the bit line BL is shared by two memory cell layers which are adjacent to each other in the laminating direction of this cell array layer. Sharing the word line WL or the bit line BL in such a manner can shorten a process for the semiconductor memory, to hold down the manufacturing cost. Further, wiring which belong to different memory cell layers CA are connected by the via wiring VL extending in the laminating direction.

Next, a structure of the wiring drawing part is described which connects the word line WL, the bit line BL and the via wiring VL in the semiconductor memory according to the present embodiment.

Figure 7:
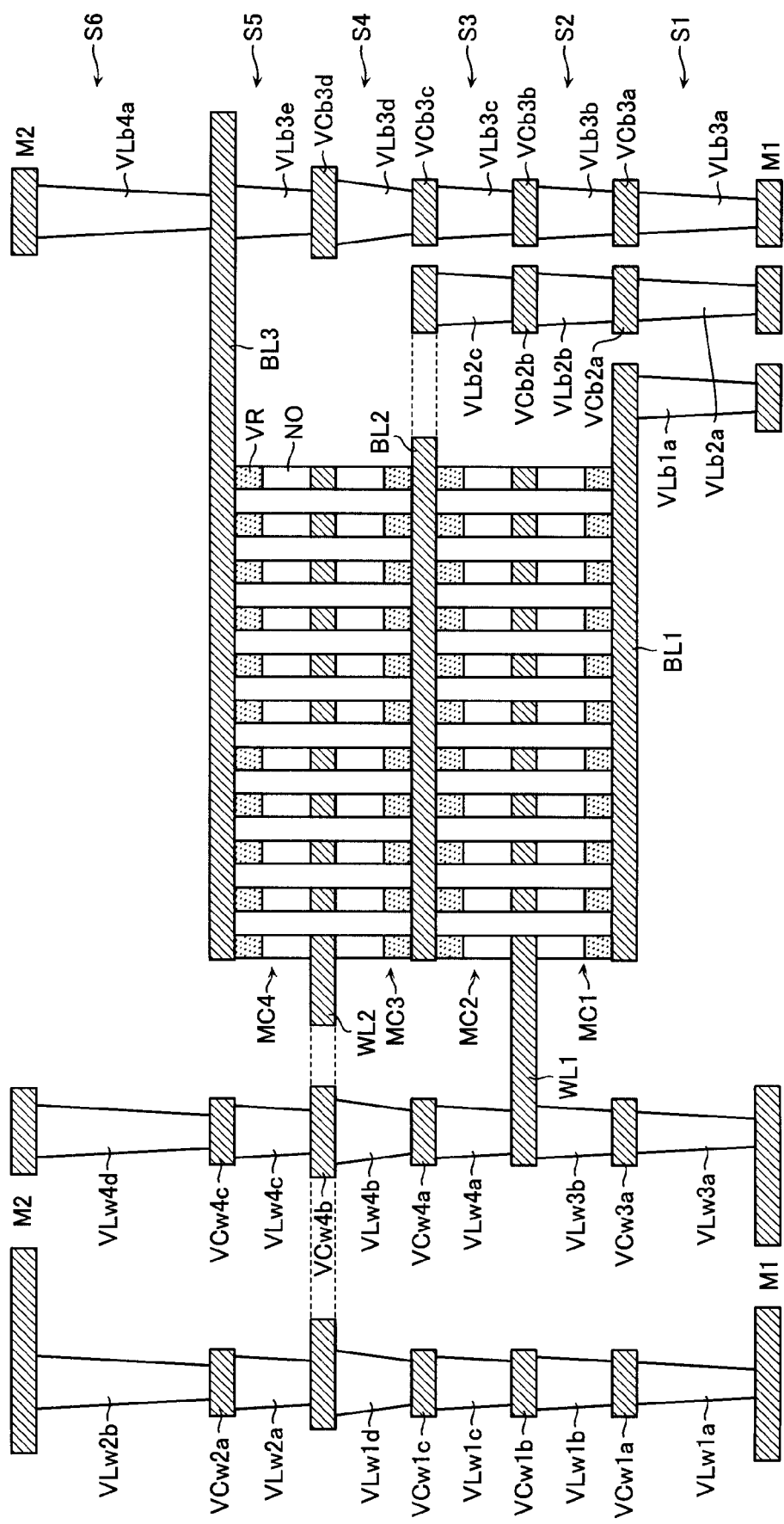
FIG. 7 is a schematic view showing connection of word lines, bit lines and via wiring in the same semiconductor memory.

FIG. 7 is a schematic view showing connection of word lines, bit lines and via wiring, as well as a sectional view along the laminating direction and the bit-line BL direction, in the semiconductor memory according to the present embodiment. It is to be noted that the wiring drawing parts of the word lines WL are shown as a sectional view along the laminating direction and the word-line WL direction for the sake of convenience of the description.

The cell array block 1 is made by sequentially forming, from the bottom layer to the top layer, the metal wiring M1, the bit line BL1, the word line WL1, the bit line BL2, the word line WL2, the bit line BL3, and the metal wiring M2. At the respective intersections of the bit line BL1 and the word line WL1, the word line WL1 and the bit line BL2, the bit line BL2 and the word line WL2, and the word line WL2 and the bit line BL3, the memory cells MC1, MC2, MC3 and MC4 are formed. In the case of this structure, the word line WL1, the bit line BL2 and the word line WL2 are respectively shared by the memory cells MC1 and MC2, the memory cells MC2 and MC3, and the memory cells MC3 and MC4.

Further, each wiring is connected by the via wiring VL extending in the laminating direction. Specifically, the metal wiring M1 and the word line WL2 are connected by four first via wiring VLw1a to VLw1d which are connected through via wiring connecting sections VCw1a to VCw1c. The word line WL2 and the metal wiring M2 are connected by two first via wiring VLw2a and VLw2b which are connected through a via wiring connecting section VCw2a. The metal wiring M1 and the word line WL1 are connected by two first via wiring VLw3a and VLw3b which are connected through a via wiring connecting section VCw3a. The word line WL1 and the metal wiring M2 are connected by four first via wiring VLw4a to VLw4d which are connected through via wiring connecting sections VCw4a to VCw4c. The metal wiring M1 and the bit line BL1 are connected by second via wiring VLb1a. The metal wiring M1 and the bit line BL2 are connected by three second via wiring VLb2a to VLb2c which are connected through via wiring connecting sections VCb2a and VCb2b. The metal wiring M1 and the bit line BL3 are connected by five second via wiring VLb3a to VLb3e which are connected through via wiring connecting sections VCb3a to VCb3d. The bit line BL3 and the metal wiring M2 are connected by second via wiring VLb4a. Herein, the via wiring connecting sections VCw1a, VCw3a, VCb2a and VCb3a are parts formed in the same layer as the bit line BL1 and separated from the bit line BL1. The via wiring connecting sections VCw1b, VCb2b and VCb3b are parts formed in the same layer as the word line WL1 and separated from the word line WL1. The via wiring connecting sections VCw1c, VCw4a and VCb3c are parts formed in the same layer as the bit line BL2 and separated from the bit line BL2. The via wiring connecting sections VCw4b and VCb3d are parts formed in the same layer as the word line WL2 and separated from the word line WL2. The via wiring connecting sections VCw2a and VCw4c are parts formed in the same layer as the bit line BL3 and separated from the bit line BL3.

The via wiring VL shown in FIG. 7 is formed in each cell array layer. Therefore, in manufacturing of the cell array block 1, formation of the via wiring VLw1a, VLw3a, VLb1a, VLb2a and VLb3a (S1), formation of the via wiring VLw1b, VLw3b, VLb2b and VLb3b (S2), formation of the via wiring VLw1c, VLw4a, VLb2c and VLb3 (S3), formation of the via wiring VLw1d, VLw4b and VLb3d (S4), formation of the via wiring VLw2a, VLw4c and VLb3e (S5), and formation of the via wiring VLw2b, VLw4d and VLb4a (S6) are executed in this order.

Figure 8:
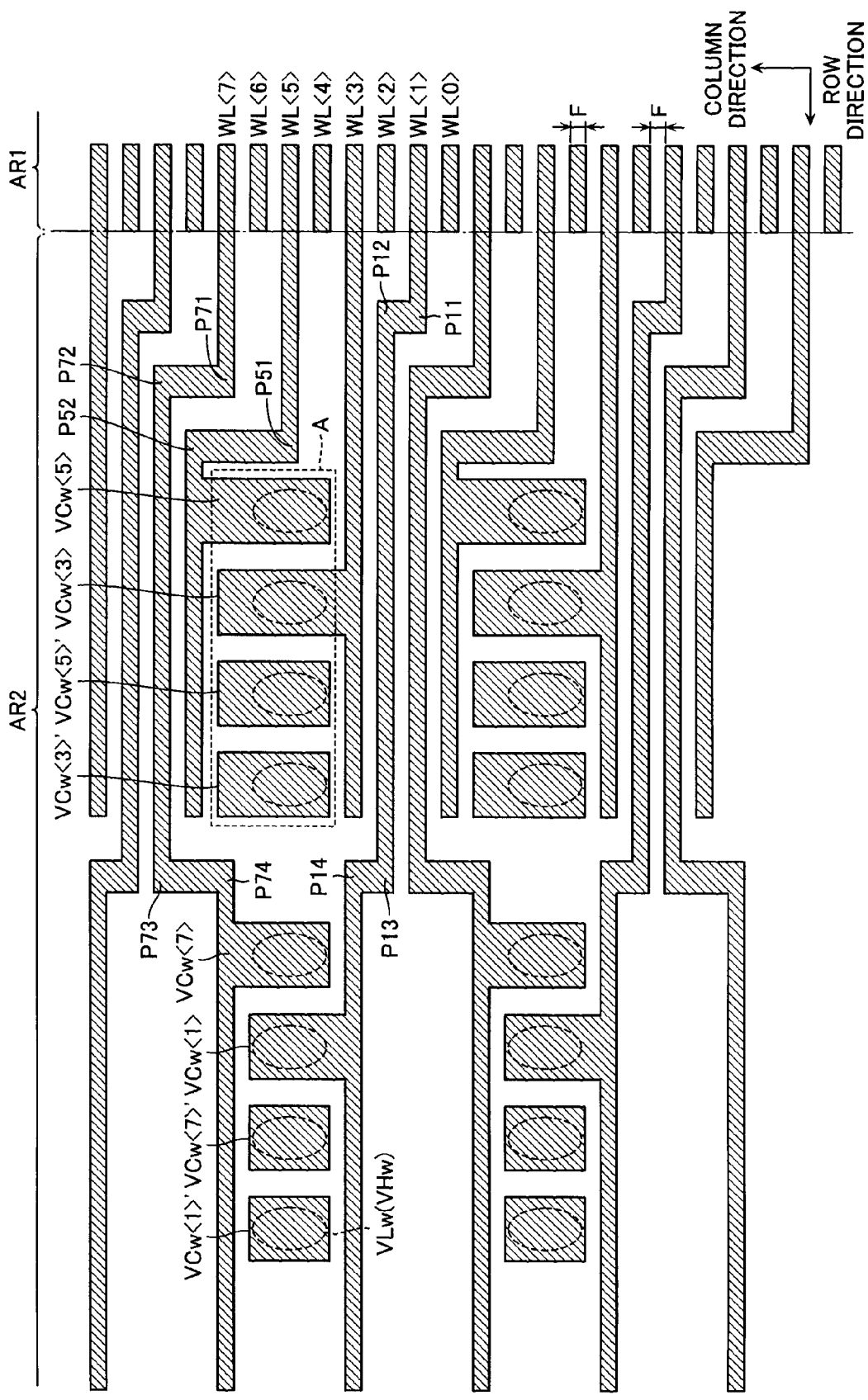
FIG. 8 is a top view showing part of the cell array layer in the same semiconductor memory.

FIG. 8 is an example of a top view showing part of the memory cell layer in the semiconductor memory according to the present embodiment.

The word line WL is formed over a memory cell area AR1 where the memory cell MC is arranged, and a peripheral area AR2 where the wiring drawing part for connection to the via wiring VLw is arranged (in the following description, a direction from the peripheral area AR2 toward the memory cell area AR1, which is parallel to the word line WL, is referred to as a "row direction", and a direction parallel to the bit line BL and orthogonal to the row direction is referred to as a "column direction").

A plurality of word lines WL are formed each having a predetermined width F (for example, 43 nm) and arranged parallel to one another at an interval of a length F in the column direction.

A predetermined word line WL<0> extends in the row direction in the memory cell area AR1 up to the boundary of the peripheral area AR2.

A word line WL<1>, which is the first from the word line WL<0> in the column direction, extends in the column direction in the memory cell area AR1 up to the boundary of the peripheral area AR2, and extends in the row direction via a position P11 which is a distance 5 F away in the row direction from this position, a position P12 which is a distance 2F away in the column direction from the position P11, a position P13 which is a distance 35 F away in the row direction from the position P12, and a position P14 which is a distance 2 F away in the column direction from the position P13. Further, a rectangular via wiring connecting section VCw<1> is formed with its vertexes at a position a distance 9 F away in the row direction from the position P14, and a position a distance 4 F away in the row direction and a distance 6.5 F away in the column direction from this position.

A word line WL<2>, which is the second from the word line WL<0> in the column direction, extends in the row direction in the memory cell area AR1 up to the boundary of the peripheral area AR2.

A word line WL<3>, which is the third from the word line WL<0> in the column direction, extends in the row direction in the memory cell area AR1 up to the boundary of the peripheral area AR2, and extends up to a position a distance 37 F away in the row direction from this position. Further, a rectangular via wiring connecting section VCw<3> is formed with its vertexes at a position a distance 21 F away in the row direction from the position of the boundary between the areas AR1 and AR2, and a position a distance 4 F away in the row direction and a distance 8.5 F away in the column direction from this position.

A word line WL<4>, which is the fourth from the word line WL<0> in the column direction, extends in the row direction in the memory cell area AR1 up to the boundary of the peripheral area AR2.

A word line WL<5>, which is the fifth from the word line WL<0> in the column direction, extends in the row direction in the memory cell area AR1 up to the boundary of the peripheral area AR2. Via a position P51 which is a distance 13 F away in the row direction from this position and via a position P52 which is a distance 6 F away in the column direction from the position P51, the word line WL<5> extends up to a position a distance 24 F away in the row direction from the position P52. Further, a rectangular via wiring connecting section VCw<5> is formed with its vertexes at a position a distance 2 F away in the row direction and a distance −8.5 F away in the column direction from the position P52, and a position a distance 4 F away in the row direction and a distance 8 F away in the column direction from this position.

A word line WL<6>, which is the sixth from the word line WL<0> in the column direction, extends in the row direction in the memory cell area AR1 up to the boundary of the peripheral area AR2.

A word line WL<7>, which is the seventh from the word line WL<0> in the column direction, extends in the row direction in the memory cell area AR1 up to the boundary of the peripheral area AR2, and extends in the row direction via a position P71 which is a distance 9 F away in the row direction from this position, a position P72 which is a distance 4 F away in the column direction from the position P71, a position P73 which is a distance 32 F away in the row direction from the position P72, and a position P74 which is a distance −4 F away in the column direction from the position P73. Farther, a rectangular via wiring connecting section VCw<7> is formed with its vertexes at a position a distance 3 F away in the row direction and a distance −6.5 F away in the column direction from the position P74, and a position a distance 4 F away in the row direction and a distance 6.5 F away in the column direction from this position.

Further, island-like via wiring connecting sections VCw<1>', VCw<3>', VCw<5>' and VCw<7>' are formed which are not connected to any of those word lines WL<0> to WL<7>.

The via wiring connecting section VCw<1>' is a rectangular area with its vertexes at a position a distance 21 F away in the row direction and a distance −6.5 F away in the column direction from the position P74, and at a position a distance 4 F away in the row direction and a distance 5 F away in the column direction from this position.

The via wiring connecting section VCw<3>' is a rectangular area with its vertexes at a position a distance 20 F away in the row direction and a distance −8.5 F away in the column direction from the position P52, and at a position a distance 4 F away in the row direction and a distance 7 F away in the column direction from this position.

The via wiring connecting section VCw<5>' is a rectangular area with its vertexes at a position a distance 14 F away in the row direction and a distance −8.5 F away in the column direction from the position P52, and at a position a distance 4 F away in the row direction and a distance 7 F away in the column direction from this position.

The via wiring connecting section VCw<7>' is a rectangular area with its vertexes at a position a distance 15 F away in the row direction and a distance 1.5 F away in the column direction from the position P74, and at a position a distance 4 F away in the row direction and a distance 5 F away in the column direction from this position.

The surfaces, not shown, of these via wiring connecting sections VCw<1>', VCw<3>', VCw<5>' and VCw<7>' are connected to the word line WL in the lower layer through the via wiring VLw. Meanwhile, the shown surfaces are connected to the word line WL in the upper layer through the via wiring VLw. Namely, the via wiring connecting sections VCw<1>', VCw<3>', VCw<5>' and VCw<7>' serve to bridge the connection of the word lines WL in the lower layer and the upper layer.

The above layout pattern made up of the word lines WL<0> to WL<7> and the via wiring connecting sections VCw<1>', VCw<3>', VCw<5>' and VCw<7>' is repeatedly arranged in the column direction.

As shown in FIG. 8, a cross section, orthogonal to the laminating direction, of each via wiring VLw (via wiring hole VHw) has an elliptical shape (in the following description, when a term "cross section" is used, it refers to a cross section of via wiring orthogonal to the laminating direction of cell array layers). Further, the via wiring VLw (via wiring hole VHw) is arranged such that a longer-diameter direction of this "cross section" is a direction perpendicular to the word-line WL direction (or the bit-line BL direction).

Herein, the above-mentioned "orthogonal" and "perpendicular" do not strictly mean so, but may be almost orthogonal and almost perpendicular, respectively. Nor does the "elliptical shape" strictly mean so, but may be a shape in which a shorter-side direction and a loner-side direction can be distinguished from each other. The same holds true for second and subsequent embodiments.

Further, a similar peripheral area to the peripheral area AR2 shown in FIG. 8 is also formed at the other end of the word line WL, and wiring drawing parts of the word lines WL<0>, WL<>, WL<4> and WL<6> are arranged. As thus described, separately arranging the drawing part of the word line WL<i> ("i" is an even number) and the wiring drawing part of the word line WL<i+1> in the two peripheral areas AR2 formed at both ends of the word line WL provides a space for arrangement of via wiring and the like in a column directional layout of the peripheral area AR2.

Next, a size of an arrangement area A surrounded by a dotted line in FIG. 8 is described with reference to FIG. 9.

Figure 9:
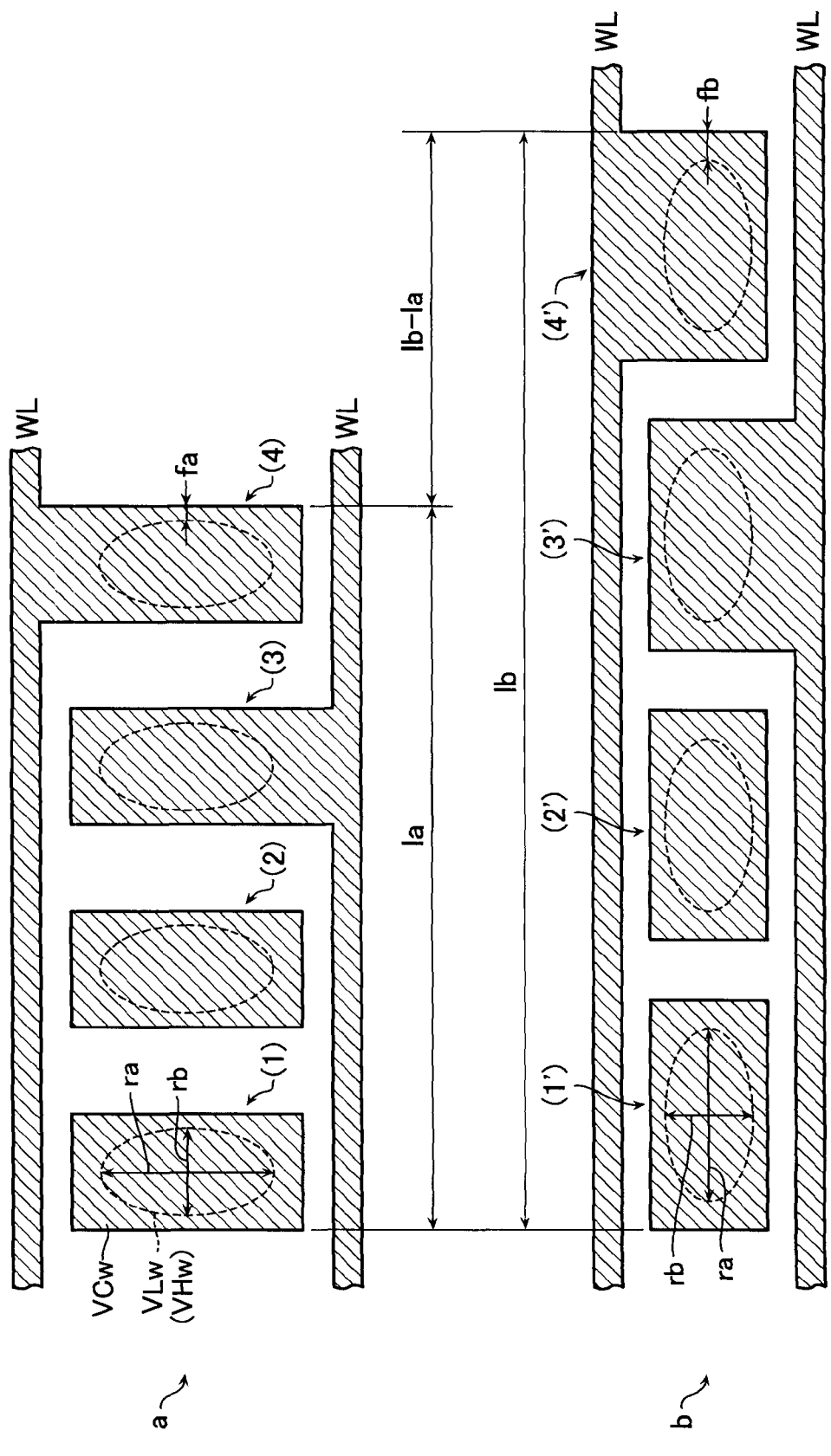
FIG. 9 is a view showing layouts of wiring drawing parts of word lines in the same semiconductor memory.

"a" in FIG. 9 is the case of the present embodiment. (1), (2), (3) and (4) in FIG. 9 correspond respectively to the via wiring contacts VCw<3>', VCw<5>', VCw<3> and VCw<5> shown in FIG. 8. Meanwhile, "b" in FIG. 9 is a comparative example in the case of arranging a longer-diameter (ra) direction of the "cross section" of the via wiring VL in the direction of the word line WL. (1') to (4') in FIG. 9 correspond respectively to (1) to (4) in FIG. 9.

In the case of the present embodiment, the word-line WL directional length of the "cross section" of the via wiring VL is naturally shorter than in the case of the comparative example. Further, arraying a plurality of via wiring holes VH in a shorter-diameter rb direction of the "cross section" allows realization of a denser layout pattern than in the case of the comparative example. In this case, a process window for lithography expands to suppress dimensional variations, resulting in that a fringe fa of the via wiring connecting section. VCw in the word-line WL direction in the case of the present embodiment can be made smaller than a fringe fb in the case of the comparative example.

From the above respect, in the case of the comparative example, the word-line WL directional length of the arrangement area for the four via wiring VLw (via wiring holes VHw) is a length lb, whereas in the case of the present embodiment, it can be made a length la which is shorter than the length lb.

It is to be noted that in the case of the present embodiment, a bit-line BL directional width of the arrangement area for the via wiring VL is larger than that in the comparative example. However, as described above, the space is generated in the bit-line BL directional layout of the peripheral area AR2. Using this space can suppress an increase in bit-line BL directional width of the arrangement area to a certain extent. That is, comprehensively considering the reduced width of the word-line WL directional size and the expanded width of the bit-line BL directional size, it is possible to suppress an increase in chip area as a whole.

Further, for a similar reason, in the case of making the shape of the "cross section" of the via wiring VL an ellipse as in the present embodiment, slightly increasing the bit-line BL directional width of the arrangement area for the via wiring VL can ensure a large contact area between the via wiring VL and the word line WL, rather than in the case of making the shape of the "cross section" a perfect circle with a diameter having the same length as the shorter diameter of this ellipse.

Although the peripheral area AR2 of the word line WL has been described above, wiring drawing parts which are similar to those in FIGS. 8 and 9 are also formed as for the bit lines BL. It is thereby possible to reduce a bit-line BL directional width of an arrangement area for the via wiring VLb.

According to the present embodiment, the longer-diameter ra direction of the "cross section" of the first via wiring VLw is formed perpendicular to the word-line WL direction and the longer-diameter ra direction of the "cross section" of the second via wiring VLb is formed perpendicular to the bit-line BL direction, whereby it is possible to suppress an increase in chip area accompanied by formation of the via wiring VL. It is thus possible to hold down the manufacturing cost of the semiconductor memory.

[Second Embodiment]

Figure 10:
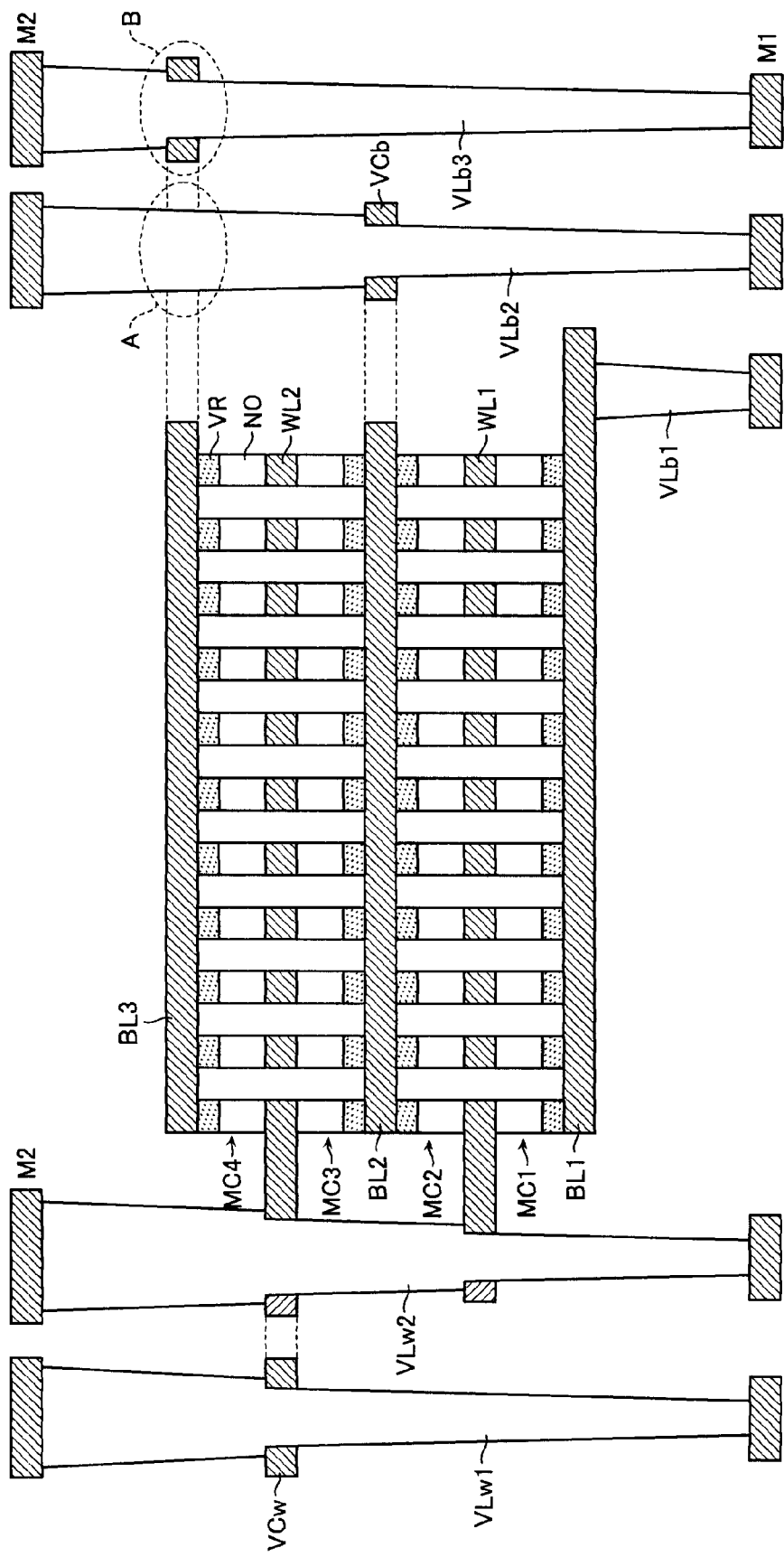
FIG. 10 is a schematic view showing connection of word lines, bit lines and via wiring in a semiconductor memory according to a second embodiment.

FIG. 10 is a schematic view showing connection of the word lines WL, the bit lines BL and the via wiring VL, as well as a sectional view along the laminating direction and the bit-line BL direction, in a semiconductor memory according to a second embodiment. It is to be noted that the wiring drawing parts of the word lines WL are shown as a sectional view along the laminating direction and the word-line WL direction for the sake of convenience of the description.

This cell array block 1 includes a plurality of cell array layers similar to the first embodiment shown in FIG. 7.

Further, the word line WL, the bit line BL and each of the metal wiring M are connected by the via wiring VL. Specifically, the metal wiring M1, the word line WL2 and the metal wiring M2 are connected by first via wiring VLw1. This via wiring VLw1 has a stepwise cross section provided at a height of the upper surface of the word line WL2. With this step, the via wiring VLw1 is connected with a via wiring connecting section VCw formed in the wiring drawing part of the word line WL2. The metal wiring M1, the word lines WL1 and WL2 and the metal wiring M2 are connected by first via wiring VLw2. This via wiring VLw2 has a stepwise cross section provided at a height of the upper surface of each of the word lines WL1 and WL2. With this step, the via wiring VLw2 is connected with the via wiring connecting section VCw of each of the word lines WL1 and WL2. The metal wiring M1 and the bit line BL1 are connected by second via wiring VLb1. The metal wiring M1, the bit line BL2 and the metal wiring M2 are connected by second via wiring VLb2. This via wiring VLb2 has a stepwise cross section provided at a height of the upper surface of the bit line BL2. With this step, the via wiring VLb2 is connected with a via wiring connecting section VCb formed in the wiring drawing part of the bit line BL2. The metal wiring M1, the bit line BL3 and the metal wiring M2 are connected by second via wiring VLb3. This via wiring VLb3 has a stepwise cross section provided at a height of the upper surface of the bit line BL3. With this step, the via wiring VLb3 is connected with the via wiring connecting section VCb formed in the wiring drawing part of the bit line BL3.

According to the structure shown in FIG. 10, it is possible to connect separated wiring or three or more wiring by one via wiring VL that can be formed collectively. That is, the process accompanied by formation of the via wiring VL can be shortened more than with the structure shown in FIG. 7.

Subsequently, the wiring drawing part of the word line WL is described.

Figure 11:
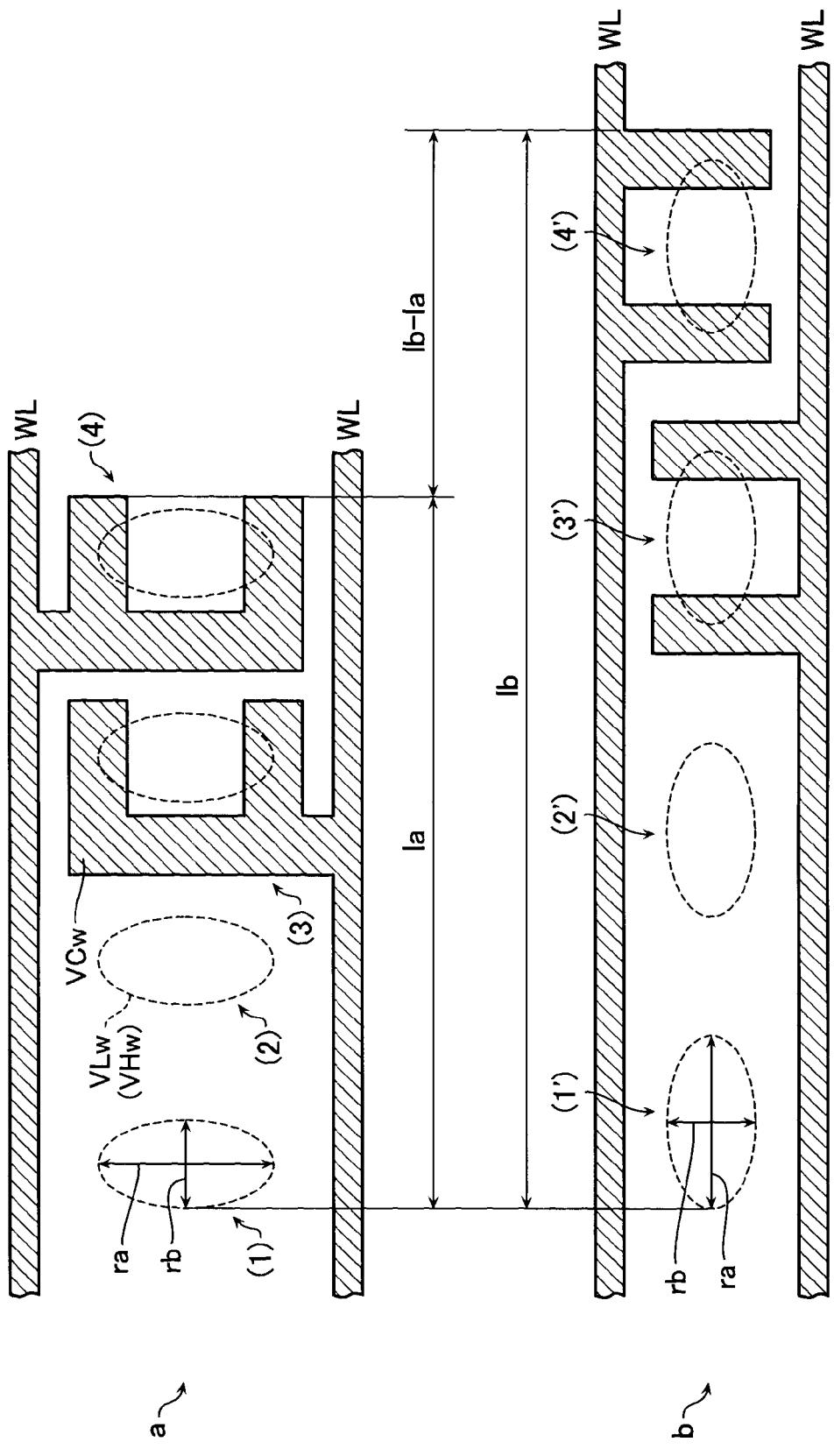
FIG. 11 is a view showing layouts of wiring drawing parts of word lines in the same semiconductor memory.

FIG. 11 is an example of layouts of the wiring drawing parts of the word lines WL in an intermediate wiring layer through which four first via wiring VLw penetrate. "a" in FIG. 11 shows the case of the present embodiment, and "b" in FIG. 11 shows a comparative example. Further, each of (1) and (2) in FIG. 11 is a layout of a place where the wiring in the intermediate wiring layer and the via wiring VL are not connected as shown in a dotted-line circle A in FIG. 10, and each of (3) and (4) in FIG. 11 is a layout of a place where the wiring in the intermediate wiring layer and the via wiring VL are connected as shown in a dotted-line circle B in FIG. 10.

As shown in (3) and (4) in FIG. 11, the via wiring connecting section VCw of the present embodiment has two plate-like portions which are formed so as to sandwich both side surfaces in contact with the longer diameter ra of the "cross section" of the via wiring VLw. With steps provided on the upper surfaces of the plate-like portions and the via wiring VLw, the via wiring VLw and the word line WL are connected. Using the via wiring connecting section VCw in such a shape can ensure a uniform contact area to a certain extent between the via wiring VLw and the via wiring connecting section VCw even in the case of the via wiring VLw being displaced in the bit-line BL direction.

Also in the semiconductor memory shown in FIG. 10, as compared with the case as shown in "b" in FIG. 11 where the longer-diameter ra direction of the "cross section" of the via wiring VLw is arranged parallel to the word-line WL direction, in the case as shown in "a" in FIG. 11 where the longer-diameter ra direction of the "cross section" of the via wiring VLw is arranged perpendicular to the word-line WL direction, the word-line WL directional size of the arrangement area for the via wiring VLw can be made small.

Figure 12:
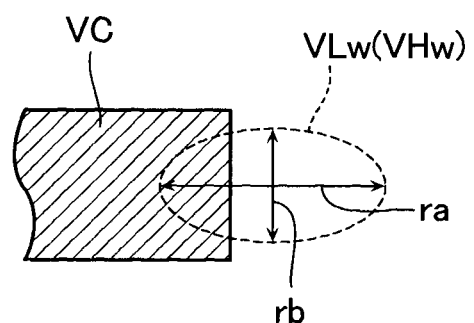
FIG. 12 is a view showing another example of a via wiring connecting section in the same semiconductor memory.

It should be noted that, other than the shape shown in FIG. 11, the via wiring connecting section VCw may have only one plate-like portion which is formed so as to be in contact with only one side surface in contact with the longer diameter ra of the "cross section" of the via wiring VLw, as shown in FIG. 12. In this case, as compared with the via wiring connecting section VCw shown in FIG. 11, the layout area of the via wiring connecting section VCw can be made small, so as to make the arrangement area for the via wiring VLw smaller.

Although the wiring drawing parts of the word lines WL have been described above, wiring drawing parts which are similar to those of FIGS. 11 and 12 are also formed as for the bit lines BL. It is thereby possible to reduce a bit-line BL directional width of an arrangement area for the via wiring VLb.

According to the present embodiment, a similar effect to that of the first embodiment can be obtained even in the case of the semiconductor memory with a structure to connect separated wiring or three or more wiring by one via wiring VL that can be formed collectively.

[Third Embodiment]

In a third embodiment, the first via wiring VLw connected to the word line WL is formed such that the longer-diameter ra direction of the "cross section" of this via wiring VLw is perpendicular to the word line WL, while the second via wiring VLb connected to the bit line BL is formed such that the longer-diameter ra direction of the "cross section" of this via wiring VLb is parallel to the bit line BL.

Namely, the wiring drawing parts of the word lines WL are laid out similarly to "a" in FIG. 9 or "a" in FIG. 11, while the wiring drawing parts of the bit lines BL are laid out similarly to "b" in FIG. 9 or "b" in FIG. 11.

In this case, with the longer-diameter ra direction of the "cross section" of every via wiring VL being perpendicular to the word-line WL direction (or parallel to the bit-line BL direction), layout patterns of the via wiring VL and the via wiring connecting sections VC can be unified. Thereby, in addition to reducing the word-line WL directional size of the arrangement area for the via wiring VL, it is possible to make the manufacturing easier than in the cases of the first and second embodiments.

There is a problem with the present embodiment in that the bit-line BL directional size of the arrangement area for the via wiring VL becomes large as compared with the first and second embodiments. However, as shown in FIG. 13, the longer diameter of the "cross section" of the via wiring VL which is not connected with the bit line BL in the intermediate wiring layer is made a length ra' that is shorter than the length ra, whereby it is possible to reduce an increase in bit-line BL directional size of the arrangement area. The reason for this is as follows. In the case of the via wiring VL connected to many intermediate wiring layers, the via wiring VL needs to be formed with its cross section being large to a certain extent due to the need for formation of many steps in light of a contact area with wiring in the lower layer, whereas in the case of the via wiring VL connected only to a few intermediate wiring layers, a contact area with wiring in the lower layer can be ensured to a certain extent even when its cross section is small due to no need for formation of many steps.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Although the descriptions have been given above taking the first wiring as the word line and the second wiring as the bit line, a similar effect can be obtained even in the case of taking the first wiring as the bit line and the second wiring as the word line.

Further, although the semiconductor memory using the ReRAM as the memory cell has been described, any semiconductor memory can be applied as long as having a laminating structure.

What is claimed is:

1. A semiconductor memory device comprising:
a semiconductor substrate;
a cell array block having, above the semiconductor substrate, a plurality of first and second wirings intersecting with one another, and a plurality of memory cells connected to respective intersections of the first and second wirings, the first and second wirings being separately formed in a plurality of layers in a perpendicular direction to the semiconductor substrate; and
a first via wiring, directly connected to the first wiring in an $n_1$-th layer ($n_1$ is a natural number) of the cell array block and at least one of the first wiring in an $n_2$-th layer ($n_2$ is a natural number other than $n_1$), the semiconductor substrate and another metal wiring, and extending in a laminating direction of the cell array block,
the first via wiring having a cross section orthogonal to the laminating direction of the cell array block, the cross section having an elliptical shape and a longer diameter in a direction perpendicular to the first wiring direction.

2. The semiconductor memory device according to claim 1, wherein
at least one of the first via wirings is formed so as to penetrate through an intermediate wiring layer, the intermediate wiring layer including at least one of the first wiring layer, the second wiring layer and another metal wiring layer between the $n_1$-th layer and the $n_2$-th layer.

3. The semiconductor memory device according to claim 2, wherein
at least one of the first wirings, the second wirings and the metal wirings in the intermediate wiring layers has a via wiring connecting section connected to the first via wiring, and
the via wiring connecting section has two plate-like portions in contact with both ends of a longer diameter of a cross section of the first via wiring.

4. The semiconductor memory device according to claim 3, wherein
a step is formed on a side surface of the first via wiring at a position in contact with the via wiring connecting section, in the laminating direction of the cell array block.

5. The semiconductor memory device according to claim 2, wherein
at least one of the first wiring, the second wiring and the metal wiring in the intermediate wiring layer has a via wiring connecting section connected to the first via wiring, and
the via wiring connecting section has one plate-like portion in contact with one end of a longer diameter of a cross section of the first via wiring.

6. The semiconductor memory device according to claim 5, wherein
a step is formed on a side surface of the via wiring at a position in contact with the via wiring connecting section, in the laminating direction of the cell array block.

7. The semiconductor memory device according to claim 2, wherein
the first via wiring has a cross section with a longer diameter shorter than that of another first via wiring, the another first via wiring being directly connected to the first wiring, the second wiring or another metal wiring in the intermediate wiring layer, the number of direct contacts of the another first via wiring with the intermediate wiring layer being larger than the number of direct contacts of the first via wiring with the intermediate wiring layer.

8. A semiconductor memory device comprising:
a semiconductor substrate;
a cell array block having, above the semiconductor substrate, a plurality of first and second wirings intersecting with one another, and a plurality of memory cells connected to respective intersections of the first and second wirings, the first and second wirings being separately formed in a plurality of layers in a perpendicular direction to the semiconductor substrate;

a first via wiring, directly connected to the first wiring in an $n_1$-th layer ($n_1$ is a natural number) of the cell array block and at least one of the first wiring in an $n_2$-th layer ($n_2$ is a natural number other than $n_1$), the semiconductor substrate and another metal wiring, and extending in a laminating direction of the cell array block; and a second via wiring, directly connected to the second wiring in an $m_1$-th layer ($m_1$ is a natural number) of the cell array block and at least one of the second wiring in an $m_2$-th layer ($m_2$ is a natural number other than $m_1$), the semiconductor substrate and another metal wiring, and extending in the laminating direction of the cell array block, the first via wiring having a cross section orthogonal to the laminating direction of the cell array block, the cross section having an elliptical shape and a longer diameter in a direction perpendicular to the first wiring direction, the second via wiring having a cross section orthogonal to the laminating direction of the cell array block, the cross section having an elliptical shape and a longer diameter in a direction perpendicular to the second wiring direction.

9. The semiconductor memory device according to claim 8, wherein at least one of (A) and (B) is satisfied, (A) being a condition that at least one of the first via wirings is formed so as to penetrate through a first intermediate wiring layer, the first intermediate wiring layer including at least one of the first wiring layer, the second wiring layer and another metal wiring layer between the $n_1$-th layer and the $n_2$-th layer; and (B) being a condition that at least one of the second via wirings is formed so as to penetrate through a second intermediate wiring layer, the second intermediate wiring layer including at least one of the first wiring layer, the second wiring layer and another metal wiring layer between the $m_1$-th layer and the $m_2$-th layer.

10. The semiconductor memory device according to claim 9, wherein at least one of the first wirings, the second wirings and the metal wirings in the first and second intermediate wiring layers has a via wiring connecting section connected to the first or second via wiring, and the via wiring connecting section has two plate-like portions in contact with both ends of a longer diameter of a cross section of the first or second via wiring.

11. The semiconductor memory device according to claim 10, wherein a step is formed on a side surface of the first via wiring or the second via wiring at a position in contact with the via wiring connecting section, in the laminating direction of the cell array block.

12. The semiconductor memory device according to claim 9, wherein at least one of the first wiring, the second wiring and the metal wiring in the first and second intermediate wiring layers has a via wiring connecting section connected to the first or second via wiring, and the via wiring connecting section has one plate-like portion in contact with one end of a longer diameter of a cross section of the first or second via wirings.

13. The semiconductor memory device according to claim 12, wherein a step is formed on a side surface of the first via wiring or the second via wiring at a position in contact with the via wiring connecting section, in the laminating direction of the cell array block.

14. The semiconductor memory device according to claim 9, wherein at least one of the first and second via wirings has a cross section with a longer diameter shorter than those of other first and second via wirings, the other first and second via wirings being directly connected to the first wiring, the second wiring or another metal wiring in the first and second intermediate wiring layers, the number of direct contacts of the other first and second via wirings with the intermediate wiring layer being larger than the number of direct contacts of the at least one of the first and second via wirings with the intermediate wiring layer.

15. A semiconductor memory device comprising:

a semiconductor substrate;

a cell array block having, above the semiconductor substrate, a plurality of first and second wirings intersecting with one another, and a plurality of memory cells connected to respective intersections of the first and second wirings, the first and second wirings being separately formed in a plurality of layers in a perpendicular direction to the semiconductor substrate;

a first via wiring, directly connected to the first wiring in an $n_1$-th layer ($n_1$ is a natural number) of the cell array block and at least one of the first wiring in an $n_2$-th layer ($n_2$ is a natural number other than $n_1$), the semiconductor substrate or another metal wiring, and extending in a laminating direction of the cell array block; and a second via wiring, directly connected to the second wiring in an $m_1$-th layer ($m_1$ is a natural number) of the cell array block and at least one of the second wiring in an $m_2$-th layer ($m_2$ is a natural number other than $m_1$), the semiconductor substrate and another metal wiring, and extending in the laminating direction of the cell array block, the first via wiring and the second via wiring each having a cross section orthogonal to the laminating direction of the cell array block, the cross section having an elliptical shape and a longer diameter in a direction perpendicular to the first wiring direction.

16. The semiconductor memory device according to claim 15, wherein at least one of (A) and (B) is satisfied, (A) being a condition that at least one of the first via wirings is formed so as to penetrate through a first intermediate wiring layer, the first intermediate wiring layer including at least one of the first wiring layer, the second wiring layer and another metal wiring layer between the $n_1$-th layer and the $n_2$-th layer; and (B) being a condition that at least one of the second via wirings is formed so as to penetrate through a second intermediate wiring layer, the second intermediate wiring layer including at least one of the first wiring layer, the second wiring layer and another metal wiring layer between the $m_1$-th layer and the $m_2$-th layer.

17. The semiconductor memory device according to claim 16, wherein at least one of the first wiring, the second wiring and the metal wiring in the first and second intermediate wiring layers has a via wiring connecting section connected to the first or second via wiring, and the via wiring connecting section has two plate-like portions in contact with both ends of a longer diameter of a cross section of either the first or second via wiring.

18. The semiconductor memory device according to claim 17, wherein
   a step is formed on a side surface of the first via wiring or second via wiring at a position in contact with the via wiring connecting section, in the laminating direction of the cell array block.

19. The semiconductor memory device according to claim 16, wherein
   at least one of the first wiring, the second wiring and the metal wiring in the first and second intermediate wiring layers has a via wiring connecting section connected to the first or second via wiring, and
   the via wiring connecting section has one plate-like portion in contact with one end of a longer diameter of a cross section of either the first or second via wiring.

20. The semiconductor memory device according to claim 16, wherein
   at least one of the first and second via wirings has a cross section with a longer diameter shorter than those of other first and second via wirings, the other first and second via wirings being directly connected to the first wiring, the second wiring or another metal wiring in the first and second intermediate wiring layers, the number of direct contacts of the other first and second via wirings with the first and second intermediate wiring layers being larger than the number of direct contacts of the at least one of the first and second via wirings with the first and second intermediate wiring layers.

* * * * *